United States Patent [19]

Kyomasu et al.

[11] Patent Number: 5,385,288
[45] Date of Patent: Jan. 31, 1995

[54] BONDING APPARATUS

[75] Inventors: Ryuichi Kyomasu, Tokyo; Mitsuaki Sakakura, Saitama; Minoru Kawagishi; Tadashi Akiike, both of Tokyo, all of Japan

[73] Assignee: Kabushiki Kaisha Shinkawa, Tokyo, Japan

[21] Appl. No.: 172,041

[22] Filed: Dec. 22, 1993

[30] Foreign Application Priority Data

Dec. 24, 1992 [JP] Japan ................ 4-357386

[51] Int. Cl.$^6$ ................................ B23K 1/06
[52] U.S. Cl. ................ 228/1.1; 228/110.1; 156/580.1
[58] Field of Search ........... 156/73.1, 580.1, 580.2; 228/1.1, 110.1; 425/174.2; 264/23

[56] References Cited

U.S. PATENT DOCUMENTS

| | | | |
|---|---|---|---|
| 4,438,880 | 3/1984 | Smith et al. | 228/110.1 X |
| 4,558,596 | 12/1985 | McBrearty et al. | 228/1.1 X |
| 4,591,087 | 5/1986 | Frasch | 156/580.2 X |
| 4,877,173 | 10/1989 | Fujimoto et al. | 228/1.1 |
| 5,078,312 | 1/1992 | Ohashi et al. | 228/1.1 X |
| 5,263,630 | 11/1993 | Kanomata et al. | 228/1.1 |

Primary Examiner—David A. Simmons
Assistant Examiner—J. Sells
Attorney, Agent, or Firm—Koda and Androlia

[57] ABSTRACT

A bonding apparatus used in manufacturing semiconductor devices, etc. including an ultrasonic horn mounted to a bonding arm of the bonding apparatus via a horn support. The ultrasonic horn is provided with a bonding tool at one end and a vibration-generating source at another end, and respective values of vibrational wavelengths on both sides of the horn support are set so that the value on the bonding tool side of the horn support is 7 or greater relative to a value of 3 on the opposite side of the horn support from the capillary. In other words, the distance from the horn support to the end of the vibration-generating source is set to be ¼ of the wavelength, and the distance from the horn support to the end of the horn where the bonding tool is attached is set to be ¾ of the wavelength.

6 Claims, 2 Drawing Sheets

BONDING APPARATUS

BACKGROUND OF THE INVENTION

1. Field of the Invention

The present invention relates to a bonding apparatus and more particularly to a bonding apparatus provided with an ultrasonic bonding horn used in manufacturing of, for example, semiconductor devices.

2. Prior Art

One type of conventional bonding apparatus, a nailhead heat-and-pressure bonding type wire bonding apparatus, is shown in FIGS. 5 and 6.

In this wire bonding apparatus, a supporting shaft 2 is fastened to a bonding arm 1 and is supported on a bonding head (not shown) either directly or via a lifter arm in a rotatable fashion. The horn support 4 of an ultrasonic horn 3 is mounted to the bonding arm 1. The ultrasonic horn 3 includes a horn body 6 which has a capillary 5 at one end and a vibrator 7 at another end. The vibrator 7 is screw-connected to the horn body 6. A bonding wire (not shown) passes through the capillary 5.

More specifically, the vibrator 7 includes a vibration-generating source 8 that is secured by screws. This screw installation is called a "Langevin" method. The vibrator 7 includes: a horn attachment 9 which is screw-connected to the horn body 6, a vibration-generating source attachment shaft 10 which has a threaded portion formed on both ends and is screw-connected to the horn attachment 9, an insulating pipe 11 which is fitted over the vibration-generating source attachment shaft 10, a vibration-generating source 8 which is obtained from a plurality of stacked doughnut-shaped electrostrictive strain elements or magnetostrictors that are fitted over the insulating pipe 11, and a nut 12 which is screw-connected to the vibration-generating source attachment shaft 10 so that the vibration-generating source 8 is tightened and secured between the nut 12 and the horn attachment 9.

In this conventional ultrasonic horn 3, the vibration-generating source 8 is located on the opposite side of the horn support 4 from the capillary 5. In other words, the vibration-generating source 8 is provided across from the capillary 5. The frequency of the vibrator 7 is adjusted to a desired level by the horn attachment 9 and the nut 12. The acoustic length of the vibrator 7 needs to be an integral multiple of $\frac{1}{2}$ of the wavelength. Since there is no reason to use a lengthy vibrator, the vibrator 7 of the length equal to $\frac{1}{2}$ of the wavelength is utilized. Furthermore, the free end 13 of the vibrator 7 acts as a vibrational antinode, and the horn attachment portion 14 of the horn attachment 9 acts as a vibrational antinode. Thus, the attachment of the vibrator 7 and the horn attachment 9 is facilitated.

In use, the vibration of the vibration-generating source 8 is transmitted throughout the entire ultrasonic horn 3 so that a standing-wave vibration is created in the ultrasonic horn 3, and the required energy is supplied to the capillary 5. In a non-loaded state (i.e., when bonding is not being performed), the energy accumulates in a stable manner. In addition, the horn 3 (particularly a skillfully crafted ultrasonic horn) is designed dimension-wise so that a node is formed in the horn support 4. Thus, the amount of movement of the horn support 4 is small and the loss of the movement is small even though the ultrasonic horn 3 is mounted to the bonding arm 1. In this non-loaded state, the ultrasonic horn 3 acts like a tuning fork, and the horn support 4 receives vibrations in a symmetrical manner from the left and right sides so that there is no movement to the left or right. The vibration-generating source 8 is ordinarily driven by constant-current driving, etc. so that the amplitude is kept at a prescribed value. When the energy is used for bonding via the capillary 5, the energy equilibrium between the vibration-generating source side and the capillary side loses its balance, and the node of vibration moves, and the energy required for equilibrium is fed in. An ultrasonic bonding is thus performed.

In the above-described ultrasonic horn 3, the horn support 4 is fastened to the bonding arm 1. Thus, the vibrational node rests on the horn support 4. Accordingly, the free end 13 and the horn attachment part 14 must be located a certain fixed length (such as $\frac{1}{4}$ lambda, $\frac{3}{4}$ lambda, 5/4 lambda, in which lambda is the length of sound waves) apart from the horn support 4 so that they can form a vibrational node. Furthermore, the shape and structure of the ultrasonic horn 3 are selected so that the horn support 4 does not interfere with the bonding work. The weight and strength of the ultrasonic horn 3 itself is also a critical matter in deciding the shape and structure of the ultrasonic horn 3. In the conventional ultrasonic horn 3, the vibration-generating source 8 is installed on the opposite side of the horn support 4 from the capillary 5. Also, a vibrational node is created in the center of the vibration-generating source 8, and the distance from the horn support 4 to the free end 13 is set to be $\frac{3}{4}$ lambda in terms of the length of the sound waves. This structure has been accepted as a matter of common sense from the early date of wire bonding technology, and there has been no consideration given to the relationship of this length to the stability of bonding.

The factors which influence the vibrational characteristics are the magnitude of the energy that accumulates in an ultrasonic horn and the magnitude of the energy that is consumed. In the ultrasonic horn that uses electrostrictive strain elements or magnetostrictors as a vibration-generating source, sources of energy consumption in a non-loaded (or non-bonding) state include all mechanical loss around the periphery of the vibration-generating source because the vibration-generating source has numerous joined surfaces. However, when bonding (joining) via ultrasonic waves is performed, energy consumption at the surfaces between a workpiece and a bonding wire (both not shown) beneath the capillary and at the joined surfaces of the capillary and the horn body, etc. increases. This results in not only a progressive deterioration in Q value (an index which indicates how appropriate the vibration is) but also a deterioration in the characteristics of the vibrator. The reason for this is that the ultrasonic horn itself does not always have a single resonance point and the Q value of another frequency may become relatively high, so that the frequency jumps. The degree of deterioration in the Q value of a frequency, which is suitable for the vibration of the capillary, can change greatly during bonding and has no reproducibility. As a result, the energy is extremely difficult to control, and the vibration and amplitude of the capillary become either excessive or insufficient.

In the conventional ultrasonic horns 3, it has been extremely difficult to perform stable bonding if the temperature of the workpiece to be bonded is around 100° C. which is low for a bonding temperature.

The reason for the difficulty in low temperature bonding is as follows: At low temperatures, the hardness of the metals to be bonded are high. In addition, since there is an increasing tendency to rely on ultrasonic waves both for deforming the ball formed at the tip of the wire and for obtaining a broad fresh surface by destroying any oxide film, any variation in the ultrasonic wave vibrational energy may lead to defective bonding if left as is.

Furthermore, depending on the conditions of the workpiece, there are some cases where bonding can be completed by the application of ultrasonic waves for a short period of time such as 5 ms, and other cases where bonding cannot be achieved unless ultrasonic waves are applied for a long period of time, such as 15 ms. As a result, it has been common to set the time on the longer side, so that bonding can be accomplished on all of the pads (electrodes of a workpiece to which the a bonding wire is to be bonded). However, once bonding has been completed, any subsequent vibration acts to destroy the bonded joint, and this may result in defects.

In conventional ultrasonic horns, the alteration of any part of the horn produces a difference in the results obtained, and various different approaches have been adopted to solve the problems. More specifically, in the absence of a proper understanding of the causes of bonding defects, it was believed that a more uniform ultrasonic horn would produce more uniform characteristics. Accordingly, there were repeated design attempts to place the vibrational node more precisely in the position of the horn support, and efforts were made to finish the joined surfaces of the constituent parts of the ultrasonic horn with greater precision. However, no improvement was obtained.

As a result of intense investigations of the causes of bonding defects in conventional bonding apparatuses, the inventors of the present application have found the following:

When an ultrasonic horn 3 is caused to vibrate in a gravity-free state, the free end 13 and the horn attachment part 14 should form a vibrational antinode and vibrate. In actual experiments, a state which is close to gravity-free is created by suspending the ultrasonic horn 3 from a string near the vibrational node so that no external forces are applied. In this case, the frequencies at which vibration is obtained correspond to resonance conditions in which the overall length of the ultrasonic horn is equal to ½ lambda, one (1) lambda, 3/2 lambda, etc. At the frequency determined in the design process, the vibrational node should be located in the horn support 4. In actuality, however, the vibrational node rarely coincides precisely with the horn support 4, and it is ordinarily impossible for such a positional coincidence to continue. In the past, there has been a tendency to believe that such a non-coincidence is caused by poor precision of the constituent parts of the ultrasonic horn 3. However, the inventors of the present application have ascertained that this is not an essential problem.

Generally, the ultrasonic horn 3 is obtained from a horn body 6, which is made of a metal such as aluminum, stainless steel, etc., and a vibrator 7, which consists of electrostrictive strain elements, magnetostrictors, etc. Electrostrictive strain elements and magnetostrictors change their hardness according to mechanical stress and to the charge entering and leaving the electrodes of the vibrator 7. Accordingly, the resonance frequency also varies according to the assembly conditions and amplitude. In other words, since the frequency of such electrostrictive strain elements and magnetostrictors is not fixed at a certain level, the frequency of vibration varies, and the vibrational node shifts from the horn support 4.

However, if the horn support 4 of the ultrasonic horn 3 is not fastened in place, i.e. placed in the gravity-free state (or state which is close to gravity-free), there is almost no change in the vibrational characteristics of the ultrasonic horn 3 even if the frequency of the vibration changes.

On the other hand, if the horn support 4 of the ultrasonic horn 3 is secured in place, the horn support 4 is forcibly caused to become a vibrational node (where no vibration occurs). As a result, the front and rear parts (or the both ends) of the ultrasonic horn 3 have separate resonance frequencies. This difference in the resonance frequency alters the conditions of vibration of the capillary 5.

Accordingly, the inventors of the present application reasoned that if the frequency of the constituent elements of the ultrasonic horn 3 varies depending upon the amplitude and temperature, it is necessary to develop a method of maintaining the correlation between the input current or voltage and the intensity of the vibration of the capillary 5.

Next, the causes of the problems will be explained further.

Even if the ultrasonic horn 3 has different resonance frequencies on the front and rear sides of the horn support 4, vibration will occur according to the frequency on the high-Q side if the Q value on the capillary side is lower than the Q value on the opposite side (i.e., the vibrator side).

However, when a bonding operation is performed, the energy consumption on the capillary side is increased, and the vibration on the capillary side of the horn support 4 assumes a type of "beat resonance" state, and the control becomes impossible. There are various reasons which lead to such a deleterious state as poor mechanical finishing precision, design errors, differences in the weight of the capillary, structural factors of the workpiece being bonded, and characteristics of the vibration-generating source 8 depending on temperature and amplitude, etc.

Despite the above circumstances, the inventors of the present application have ascertained by research that changes in the conditions of vibration caused by the application of a bonding load to the ultrasonic horn are not due only to poor precision of the constituent parts of the ultrasonic horn 3.

SUMMARY OF THE INVENTION

Accordingly, the object of the present invention is to provide a bonding apparatus equipped with an ultrasonic horn which can prevent the vibration-generating source from becoming unstable due to the increased load during the bonding process and also eliminate deterioration in the bonding quality that would be caused by fluctuations in the load and temperature conditions.

The above object is accomplished by a unique structure for a bonding apparatus in which an ultrasonic horn mounted to a bonding arm includes a bonding tool which is attached to one end of the ultrasonic horn and a vibration-generating source to another end, and the unique structure is that the ultrasonic horn further includes a horn support that is used to mount the ultrasonic horn to the bonding arm, and the respective values of the vibrational wave-lengths of the ultrasonic horn on both sides of the horn support are set so that the value on the bonding tool side of the horn support is 7 or greater relative to a value of 3 on the opposite side of the horn support from the bonding tool.

The structure above was obtained as a result of various experiments. By setting the respective values of the vibrational wavelengths on both sides of the horn support as above, it is possible to prevent the vibration-generating source from becoming unstable due to the increased load during bonding. It is also possible to prevent any deterioration in the bonding quality caused by fluctuations in the load conditions or temperature conditions.

DETAILED DESCRIPTION OF THE INVENTION

Figure 1:
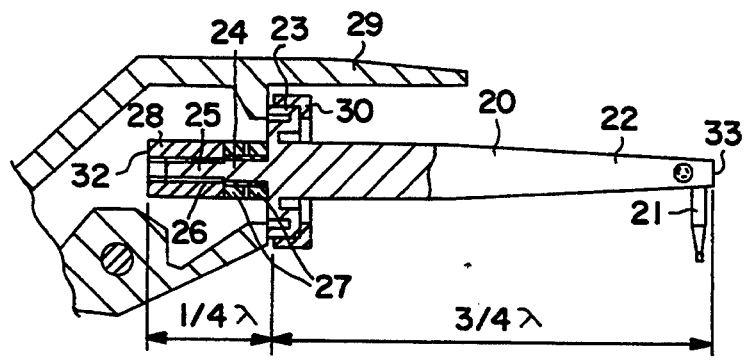
FIG. 1 shows a cross section of essential parts of a bonding apparatus according to one embodiment of the present invention.

One embodiment of the present invention will be described with reference to FIGS. 1 and 2.

The ultrasonic horn 20 includes a horn body 22, which has a bonding tool or a capillary 21 at one end. The horn body 22 has a horn support 23 on the other end, and a vibration-generating source attachment shaft 24 is extended from the end of this horn support 23. A threaded portion 25 is formed at the end of the vibration-generating source attachment shaft 24.

An insulating pipe 26 is fitted over the vibration-generating source attachment shaft 24, and a plurality of (two in the embodiment) vibration-generating sources 27 are fitted over the insulating pipe 26. The vibration-generating sources 27 are, for example, electrostrictive strain elements or magnetostrictors. The vibration-generating sources 27 are secured to the horn body 22 via a nut 28 which is screwed onto the threaded portion of the horn body 22.

The horn support 23 is held between a bonding arm 29 and a fastening plate 30, and the fastening plate 30 is fastened to the bonding arm 29 by screws 31, so that the horn support 23 is mounted to the bonding arm 30.

In this embodiment, the distance from the horn support 23 to a first free end (or root end) 32 of the horn body 22, which is on the opposite side of the horn support 23 from the capillary 21, is set to be ¼ lambda (labmda is the wave length of the sound waves), and the distance from the horn support 23 to a second free end (or tip end) 33 of the horn body 22, which is on the capillary 27 side of the horn support 23, is set to be ¾ lambda in terms of the length of the sound waves.

Thus, the ratio of the distance between the horn support 23 and the second free end 33 to the distance between the horn support 23 to the first free end 32 is ¾ lambda to ¼ lambda, or 3 to 1 (i.e. a ratio of 3). In other words, the distance between the horn support 23 and the tip end 33 is three times longer than the distance between the horn support 23 and the root end 32.

The inventors conducted various experiments using the nailhead wire bonding apparatus, as an example, and it was ascertained that the ratio of the respective lengths on both sides of the horn support has an important effect on bonding quality.

Figure 5:
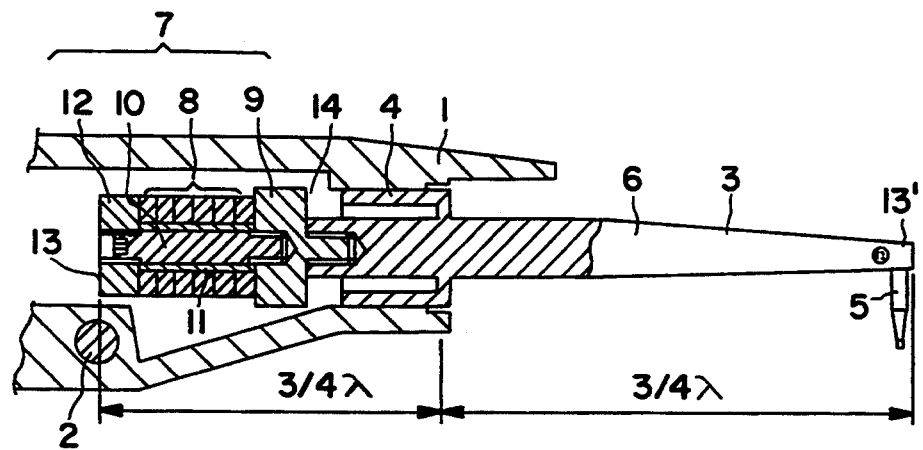
FIG. 5 shows a cross section of essential parts of the ultrasonic horn of a conventional bonding apparatus.
Figure 6:
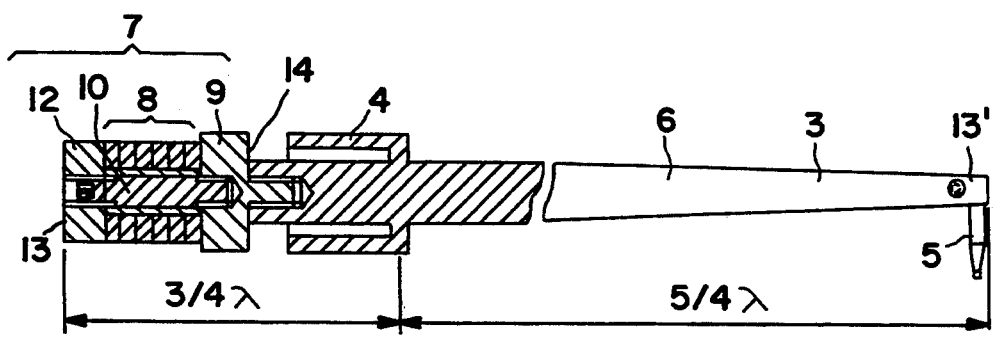
FIG. 6 shows a cross section of essential parts of another example of an ultrasonic horn of a conventional bonding apparatus.

Conventionally, as shown in FIGS. 5 and 6, the ratio of the distance between the horn support 4 and the first free and 13 and the distance between the horn support 4 and the second free end 13' has been 1 to 1 (i.e., a ratio of 1) or 3 to 5 (i.e., a ratio of 1.67), and no particular consideration has been given to this length ratio.

The results of a comparison of the embodiment of the present invention illustrated in FIG. 1 with the conventional example shown in FIGS. 5 and 6 will be discussed below.

In the conventional ultrasonic horn 3 with a ratio of 1 shown in FIG. 5, there are problems in terms of bonding defects (i.e., failure to bond, excessive crushing, etc.) in almost all workpieces. These bonding defects are thought to result from variation in the ultrasonic waves. Furthermore, the frequency with which such defects occur tends to increase with a decrease in temperature. Moreover, the performance of the ultrasonic horns 3 differs greatly, and no ultrasonic horn 3 was found to be capable of sufficient bonding if the temperature of the worksheets being bonded is below 100° C.

In the conventional ultrasonic horn 3 with a ratio of 1.67 shown in FIG. 6, the yield of the ultrasonic horn 3 itself is not high. Furthermore, bonding defects occur in some workpieces which can be controlled to an acceptable level by making repeated fine adjustments. However, low-temperature bonding is still impossible, and the bonding conditions must be finely adjusted according to the type of workpiece to be bonded and the individual bonding apparatus. In addition, control of the bonding apparatus at semi-conductor assembly locations is not easy.

Figure 2:
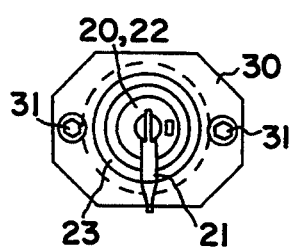
FIG. 2 is a front view thereof.

In the ultrasonic horn 20 of the present embodiment shown in FIG. 1, which has a ratio of 3, the flattening of the metal ball that is at an end of a bonding wire and bonded can vary linearly (or proportionally) with the power applied and can be thus stable.

Furthermore, stable bonding can be performed by ultrasonic oscillation for a shorter period of time than in conventional bonding apparatus, even at temperatures ranging from 80° C. down to a temperature close to room temperature.

In terms of shearing force, pulling tests and bonding shape as well, a bonding quality was obtained which was not obtainable by the conventional bonding apparatus unless the temperature of the workpiece to be bonded is over 250° C.

Thus, according to the ultrasonic horn 20 of the present invention, it is possible to form wire-based wiring by bonding without fine adjustments even at ordinary temperatures. In addition, even when the temperature of the workpiece to be bonded is below 100° C., a sufficient bonding strength comparable to that obtained in bonding at around 250° C. in the case of conventional bonding apparatuses can be obtained in half the ultrasonic vibration application time or shorter. The fact that bonding can be performed in a short time and at low temperatures means that even more stable bonding can be obtained at high temperatures (with a help of the activity of the metal of the workpiece).

Generally, when ultrasonic waves are applied for a long period of time during bonding, bonds which have already been completed are generally destroyed. Accordingly, with the short ultrasonic vibration application time secured by the present invention, it becomes possible to complete the bonding before almost any diffusion has occurred. Thus, damage by bonding can be reduced greatly.

The ability to perform low-temperature process (bonding) at temperatures below the storage or room temperature of semiconductor devices offers various advantages. The assembly of lead frames which are combined with synthetic resins and the handling of solder-plated lead frames and copper frames which tend to be oxidized at high temperatures can become easy. In addition, the warping of lead frames due to abrupt changes in temperature during shipping can be eliminated.

Moreover, a short ultrasonic vibration application time is also naturally effective in shortening the time required for bonding, and considerable time savings (10% or more) can be realized. In addition, since extremely short-time bonding is possible, the quality can be improved even further by performing the ultrasonic oscillation in synchronization with the vibration of the machinery during the bonding operation so that the load is in an ideal state.

The experimental results are theoretically supported in the following manner:

The energy which accumulates in the vibration-generating source 27 consists of movement energy, which reaches a maximum in the area of the vibrational node, and strain energy (equivalent to the strain in cases where a spring is compressed), which centers on the area of the node, and the overall energy is maintained by the exchange of these two types of energy. Accordingly, the amount of energy accumulates in the ultrasonic horn 20 depends on the length between the horn support 23 and the second free end 33 of the horn body 22. Resonance occurs at the frequency where the exchange of the energy is executed most sufficiently, and it is commonly known that this frequency is determined by the stiffness and density of the material of the vibration-generating source 27 that is vibrating. Accordingly, since Q, which indicates the vibration performance, is the ratio of the energy consumed to the energy accumulated, it is clear that the distance from the horn support 23 to the second free end 33 is important for the accumulated energy. In this case, local differences in the thickness of the ultrasonic horn are not important, since the energy per unit length is the same if the ultrasonic horn 20 vibrates as a single body.

The experimental results show that the conventional ultrasonic horn with a ratio of 1.67 begins to show defective bonding under conventional temperature and ultrasonic vibration application time conditions. From a comparison of the bonding quality levels obtained from the conventional ultrasonic horns with ratios of 1 and 1.67 and the ultrasonic horn of the present invention with a ratio of 3, a ratio of 2 or greater is required in order to perform bonding with a satisfactory margin under conventional conditions (temperature and time).

Figure 3:
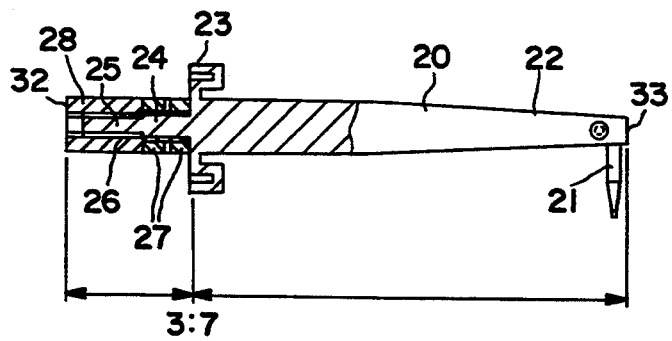
FIG. 3 shows an ultrasonic horn with a 3:7 ratio according to the present invention.
Figure 4:
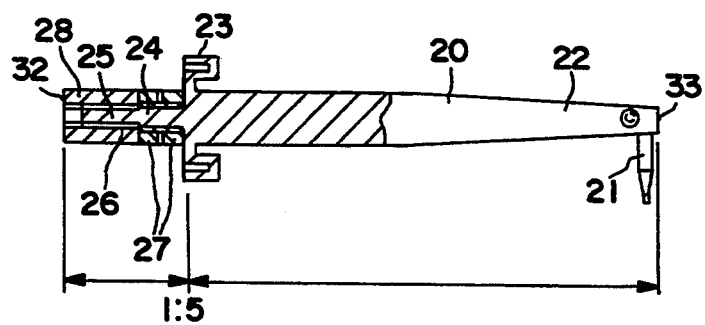
FIG. 4 shows an ultrasonic horn with a 1:5 ratio according to the present invention.

In actual ultrasonic horns, the minimum ratio that exceeds 2 and can be designed is 7/3 as shown in FIG. 3, and higher ratios which can be used are 3, 5, etc. The ultrasonic horn with a ratio of 1:5 according to the present invention is shown in FIG. 4.

The reason that the inventors first experimented with an ultrasonic horn 20 having a ratio of 3 is that this ratio was determined by restrictions arising from the frequency of the oscillator used and the attachment of the horn to the bonding apparatus. In the case of the horn with a ratio of 3 according to the present invention, bonding can be performed even at temperatures which are close to room temperature. Accordingly, the ultrasonic horn 20 with a ratio of 3 of the present invention has a more than sufficient margin for operation under conventional bonding conditions (temperature and time), and a wire bonding onto devices with structures which could not be bonded using conventional techniques is now possible by the present invention.

In the embodiments described above, the present invention is applied to a nailhead ultrasonic wave/heat-and-pressure bonding type wire bonding apparatus, and therefore, the bonding tool used is the capillary 21 through which a bonding wire is passed. However, it goes without saying that the present invention is applicable to an ultrasonic wedge type wire bonding apparatus too, and in this case the bonding tool is a wedge with a wire passing through it. The present invention can be further applied to a single tab bonding apparatus that uses a tool which connects tab leads to semiconductor elements one at a time.

As seen from the above detailed description, according to the present invention, the respective values of the vibrational wavelengths on both sides of the horn support are set so that the value on the bonding tool side of the horn support is 7 or greater relative to a value of 3 on the opposite side of the horn support from the bonding tool. Accordingly, the vibration-generating source can be prevented from becoming unstable due to the increased load during bonding. In addition, it is also possible to prevent any deterioration in the bonding quality caused by fluctuations in the load conditions or temperature conditions.

We claim:

1. A bonding apparatus including an ultrasonic horn which is mounted to a bonding arm of said bonding apparatus and provided with a bonding tool at one end of said ultrasonic horn and a vibration-generating source at another end of said ultrasonic horn, wherein said ultrasonic horn is further provided with a horn support which is used to mount said ultrasonic horn to said bonding arm, and respective values of vibrational wavelengths of said ultrasonic horn on both sides of said horn support are set so that the value on the bonding tool side of said horn support is 7 or greater relative to a value of 3 on the opposite side of the horn support from said bonding tool.

2. A bonding apparatus according to claim 1, wherein said vibration-generating source is selected from the group consisting of an electrostrictive strain element and a magnetostrictor.

3. A bonding apparatus including an ultrasonic horn which is mounted to a bonding arm of said bonding apparatus and provided with a bonding tool at one end of said ultrasonic horn and a vibration-generating source at another end of said ultrasonic horn, wherein said ultrasonic horn is further provided with a horn support which is used to mount said ultrasonic horn to said bonding arm, and a distance from said horn support to a free end of said ultrasonic horn on an opposite side of the horn support from said bonding tool is equal to $\frac{1}{4}$ of the wavelength and a distance from said horn support to another free end of said ultrasonic horn on said bonding tool side of said horn support is equal to $\frac{3}{4}$ of the wavelength.

4. A bonding apparatus according to claim 3, wherein said vibration-generating source is selected from the group consisting of an electrostrictive strain element and a magnetostrictor.

5. A bonding apparatus including an ultrasonic horn which is mounted to a bonding arm of said bonding apparatus and provided with a bonding tool at one end of said ultrasonic horn and a vibration-generating source at another end of said ultrasonic horn, wherein said ultrasonic horn is further provided with a horn support which is used to mount said ultrasonic horn to said bonding arm, and a distance from said horn support to a free end of said ultrasonic horn on an opposite side of the horn support from said bonding tool is equal to $\frac{1}{4}$ of the wavelength and a distance from said horn support to another free end of said ultrasonic horn on said bonding tool side of said horn support is equal to 5/4 of the wavelength.

6. A bonding apparatus according to claim 5, wherein said vibration-generating source is selected from the group consisting of an electrostrictive strain element and a magnetostrictor.

* * * * *